(12) United States Patent
Long

(10) Patent No.: US 6,614,216 B2
(45) Date of Patent: Sep. 2, 2003

(54) SYSTEM AND METHOD FOR INTERSAMPLE TIMING ERROR REDUCTION

(75) Inventor: Avery D. Long, Lavergne, TN (US)

(73) Assignee: Square D Company, Palatine, IL (US)

( * ) Notice: Subject to any disclaimer, the term of this patent is extended or adjusted under 35 U.S.C. 154(b) by 36 days.

(21) Appl. No.: 09/778,588

(22) Filed: Feb. 7, 2001

(65) Prior Publication Data

US 2002/0105314 A1 Aug. 8, 2002

(51) Int. Cl.[7] .......................... G01R 23/02; G01R 13/14
(52) U.S. Cl. .................................. 324/76.39; 324/76.24
(58) Field of Search ........................... 324/76.39, 76.24, 324/76.12, 647

(56) References Cited

U.S. PATENT DOCUMENTS

| | | | | |
|---|---|---|---|---|
| 4,811,052 A | * | 3/1989 | Yamakawa et al. | 399/77 |
| 5,471,176 A | * | 11/1995 | Henson et al. | 331/1 A |
| 5,742,208 A | * | 4/1998 | Blazo | 331/23 |
| 5,754,437 A | * | 5/1998 | Blazo | 327/156 |
| 6,028,488 A | * | 2/2000 | Landman et al. | 327/156 |
| 6,044,332 A | * | 3/2000 | Korsah et al. | 702/76 |

OTHER PUBLICATIONS

"Powerlogic® Advanced Power Reliability Solutions," Square D Schneider Electric, brochure, 2000, 3 pages.
"Powerlogic® Circuit Monitor —Series 2000," , Square D Schneider Electric, brochure, 3 pages.
"Powerlogic® Power Meter," , Square D Schneider Electric, brochure, 1998, 2 pages.
"Powerlogic® Metering & Monitoring Devices," Square D Schneider Electric, brochure, 2000, 2 pages.
"Powerlogic® Power Monitoring and Control System," Square D Schneider Electric, brochure, 1998, 4 pages.
"Powerlogic® Series 4000 Circuit Monitor," Square D Schneider Electric, brochure, 2000, 3 pages.
"Powerlogic® System Architecture and Application Guide," Data Bulletin, Square D Schneider Electric, May 2000.

* cited by examiner

Primary Examiner—N. Le
Assistant Examiner—John Teresinski
(74) Attorney, Agent, or Firm—Michael J. Femal; Larry I. Golden

(57) ABSTRACT

A system clock for a system for measuring at least one given quantity having a value which does not vary significantly from a given frequency, the system clock comprises a controller for sampling said given quantity at a rate determined by an oscillator frequency, and a programmable oscillator for generating the oscillator frequency, said programmable oscillator being programmable to produce said oscillator frequency at a frequency which is substantially identical to a high order harmonic of said given frequency of the quantity to be measured.

8 Claims, 4 Drawing Sheets

SYSTEM AND METHOD FOR INTERSAMPLE TIMING ERROR REDUCTION

BACKGROUND OF THE INVENTION

This invention is related generally to the timing of sampling intervals in a system for monitoring occurrences, events, or quantities, and more particularly to a system and method for reducing or minimizing intersample timing error in such applications.

While the invention may find other applications, the invention will be illustrated and described herein with reference to the specific problem of minimizing or eliminating a mismatch between the system clock and the frequency of the signal being measured in a power metering system which monitors voltages and currents at grid frequencies, such as 50 Hz or 60 Hz frequencies, or the like.

Using crystal oscillators or other oscillators at standard "off the shelf" frequencies has been noted to produce residual sampling errors or intersample timing errors when measuring voltages and currents at grid frequencies. Reducing this intersample timing error can produce more stable and reliable voltage and current measurements. As monitoring systems are developed or programmed to monitor and/or report readings on shorter and shorter time intervals, that is, at higher sampling rates, any amount of "slippage" or intersample error tends to increase, thereby potentially compromising the accuracy of the system.

OBJECTS AND SUMMARY OF THE INVENTION

Accordingly, it is a general object of the invention to provide a method and/or system for reducing intersample timing error.

Briefly and in accordance with the foregoing object, a system clock for a system for measuring at least one given quantity having a value which does not vary significantly from a given frequency, comprises a controller for sampling said given quantity at a rate determined by an oscillator frequency, and a programmable oscillator for generating said oscillator frequency, said programmable oscillator being programmable to produce said oscillator frequency at a frequency which is substantially identical to a high order harmonic of said given frequency of the quantity to be measured.

In accordance with another aspect of the invention, an improvement in a system clock for a system for measuring at least one given quantity having a periodic value which does not vary significantly from a given frequency, comprises a controller for sampling said given quantity at a rate determined by an oscillator frequency, and a programmable oscillator for generating said oscillator frequency, said programmable oscillator being programmable to produce said oscillator frequency at a frequency which is substantially identical to a high order harmonic of said given frequency of the quantity to be measured.

In accordance with another aspect of the invention, a method for controlling a sampling rate for measuring at least one given quantity which does not vary significantly from a given frequency, comprises providing a programmable oscillator, and programming said oscillator to oscillate at a frequency which is substantially identical to a high order harmonic of said given frequency.

DETAILED DESCRIPTION OF THE ILLUSTRATED EMBODIMENT

Figure 1A:
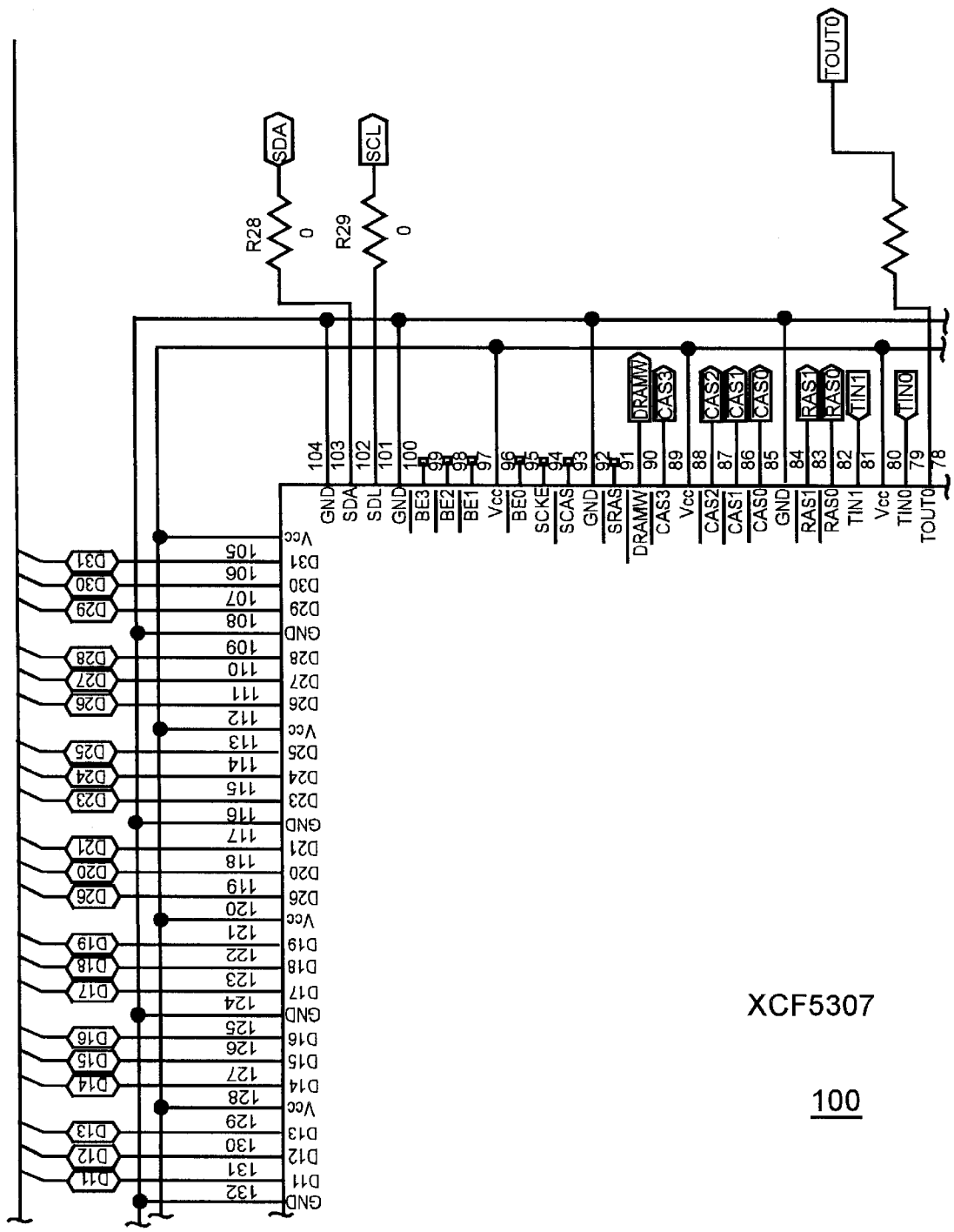
FIGS. 1A–D are schematics of different sections of the power metering device using the method and system of the present invention.

The present invention utilizes programmable oscillators in order to develop system clocks to improve accuracy in time and metering. In the embodiment described, these system clocks are a portion of industrial or commercial power meters which read voltage and/or current or other similar measurements or properties of an electrical power system. In this application, the programmable oscillators are programmed to be very close in frequency to a relatively high order harmonic of the powerline frequencies, typically 50 Hz or 60 Hz.

In a typical system, a controller such as a microcontroller, microprocessor or digital signal processor (DSP) samples voltage and current channels more accurately over the course of each cycle of the powerline frequency. In this regard, typically voltage and current readings are provided to the microcontroller or DSP which takes digital samples at some preselected, and usually relatively high, sampling rate. However, the higher the rate, the more possibility for mismatches between the system clock frequency, the sampling rate, and the frequency of the system being monitored, such as a powerline in the foregoing example.

In the present invention, the accuracy arises from the ability of the microcontroller to sample power signals at an integral sub-interval of the powerline frequency; that is, when a programmable oscillator at a harmonic of powerline frequency is utilized to drive or control the system clock. This also tends to minimize any intersample error over a cycle or multiple cycles which may occur due to the system clock not being an integral sub-interval of the powerline frequency. Reducing the intersample errors produces more stable voltage in current readings. Using a programmable oscillator as briefly described above allows these errors to be effectively nulled so that more accurate voltage and current readings can be achieved.

In one particularly useful embodiment for monitoring 50 Hz and 60 Hz systems, a programmable oscillator can be programmed to oscillate at a relatively high harmonic of both 50 Hz and 60 Hz so that there will be no timing error due to the frequency mismatch between the host processor and current on powerlines operating at either 50 Hz or 60 Hz. The frequency of the programmable oscillator can additionally be chosen to be a harmonic of 400 Hz, which is a typical frequency of aircraft wiring systems. Thus, if the programmable oscillator is a harmonic of all three of the above frequencies, it can be utilized in systems for monitoring voltages and currents at all three of the above-noted frequencies, namely, 50 Hz, 60 Hz and 400 Hz.

Examples of programmable oscillator elements which may be utilized include Model No. JITO-2 Just-in-Time Oscillators from Fox Electronics of Fort Meyers, Fla., and Model No. SG-8002JF Series Programmable High-Frequency Crystal Oscillator from Seiko, Epson Corporation, available for example, from Epson Electronics America, Inc., El Segundo, Calif.

As mentioned above, the invention is not limited to monitoring of power systems, but may also be utilized in connection with any system wherein a quantity is to be measured or monitored which has a periodic value which does not vary significantly from a given frequency.

Figure 1B:
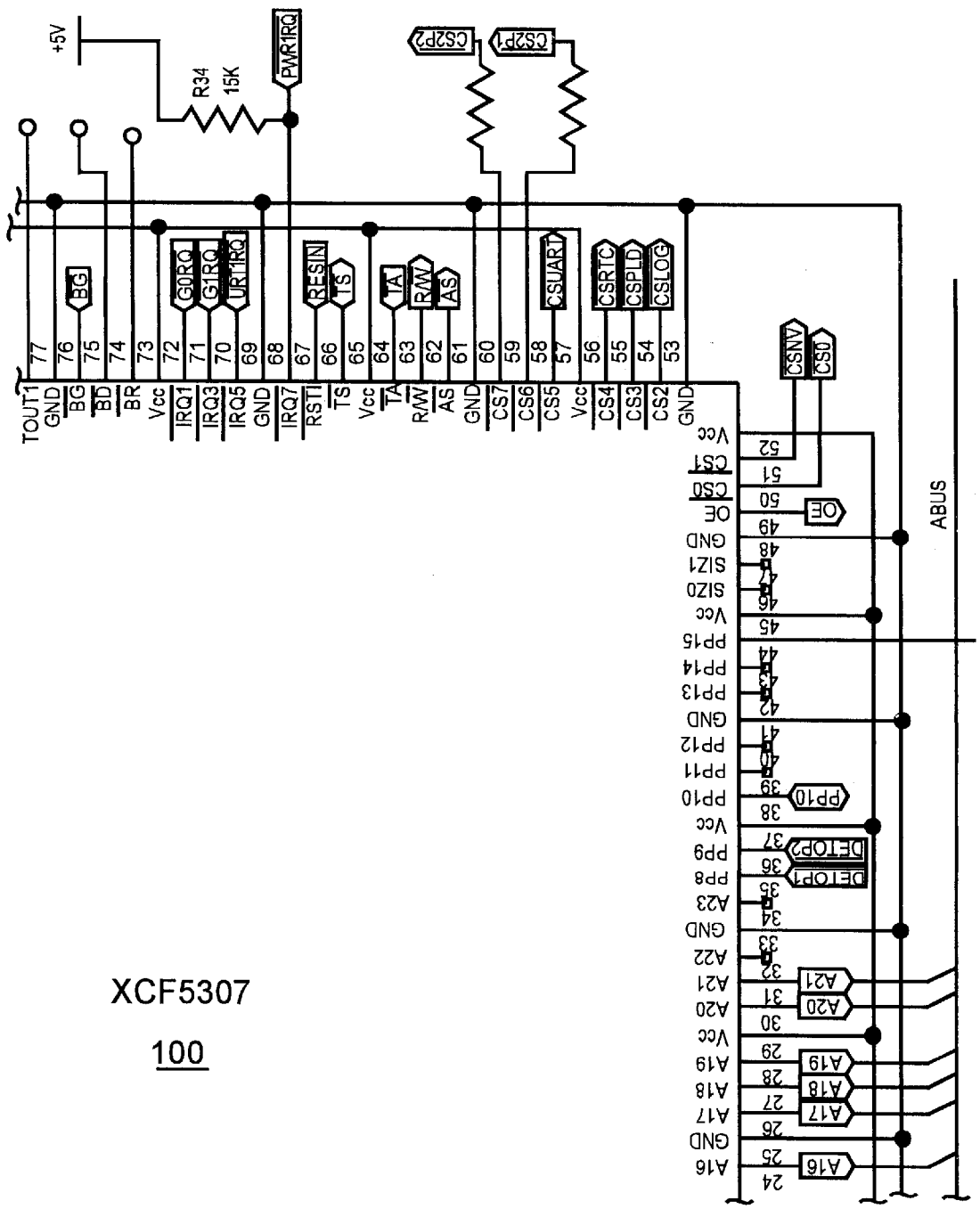
Figure 1C:
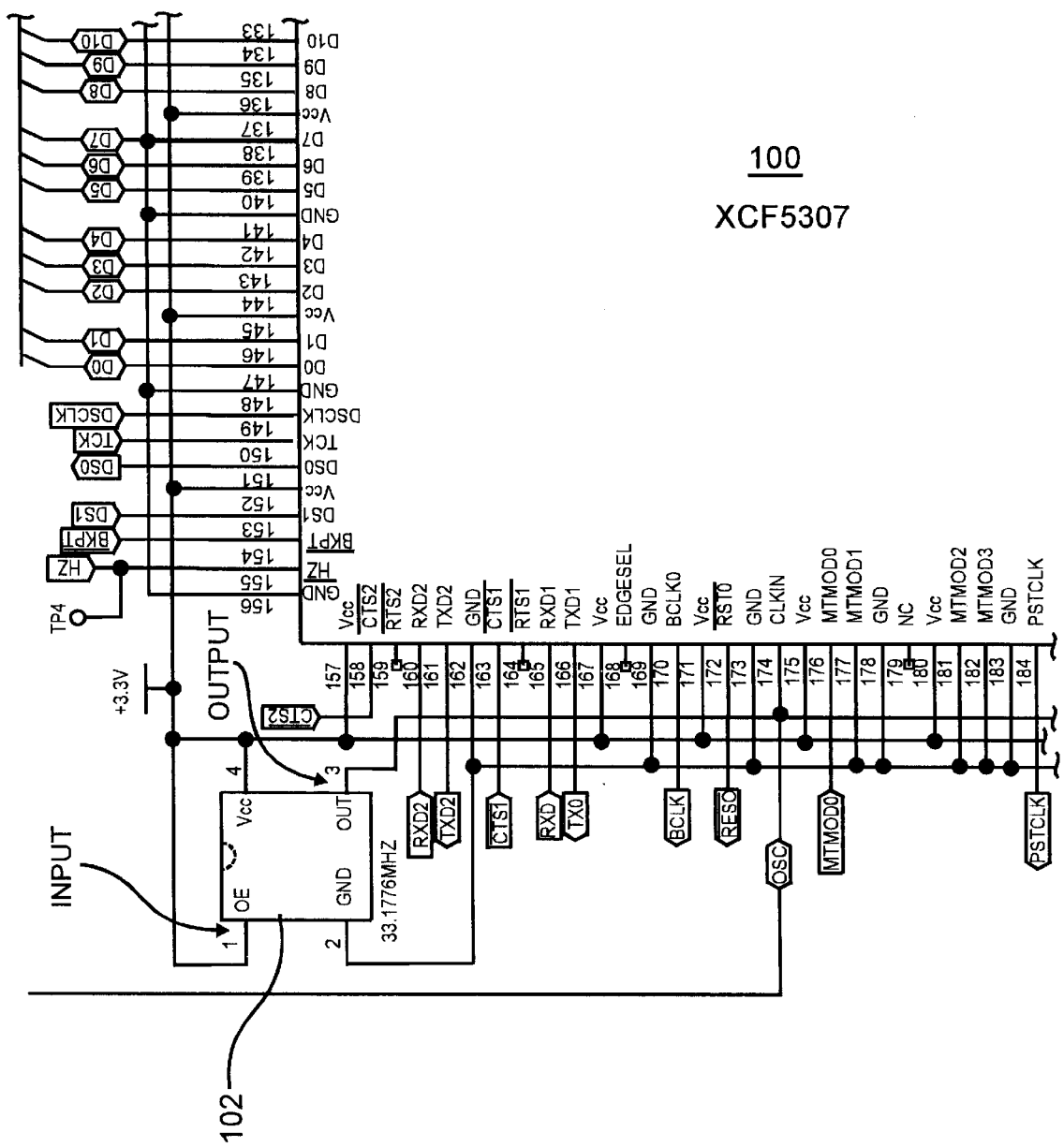
Figure 1D:
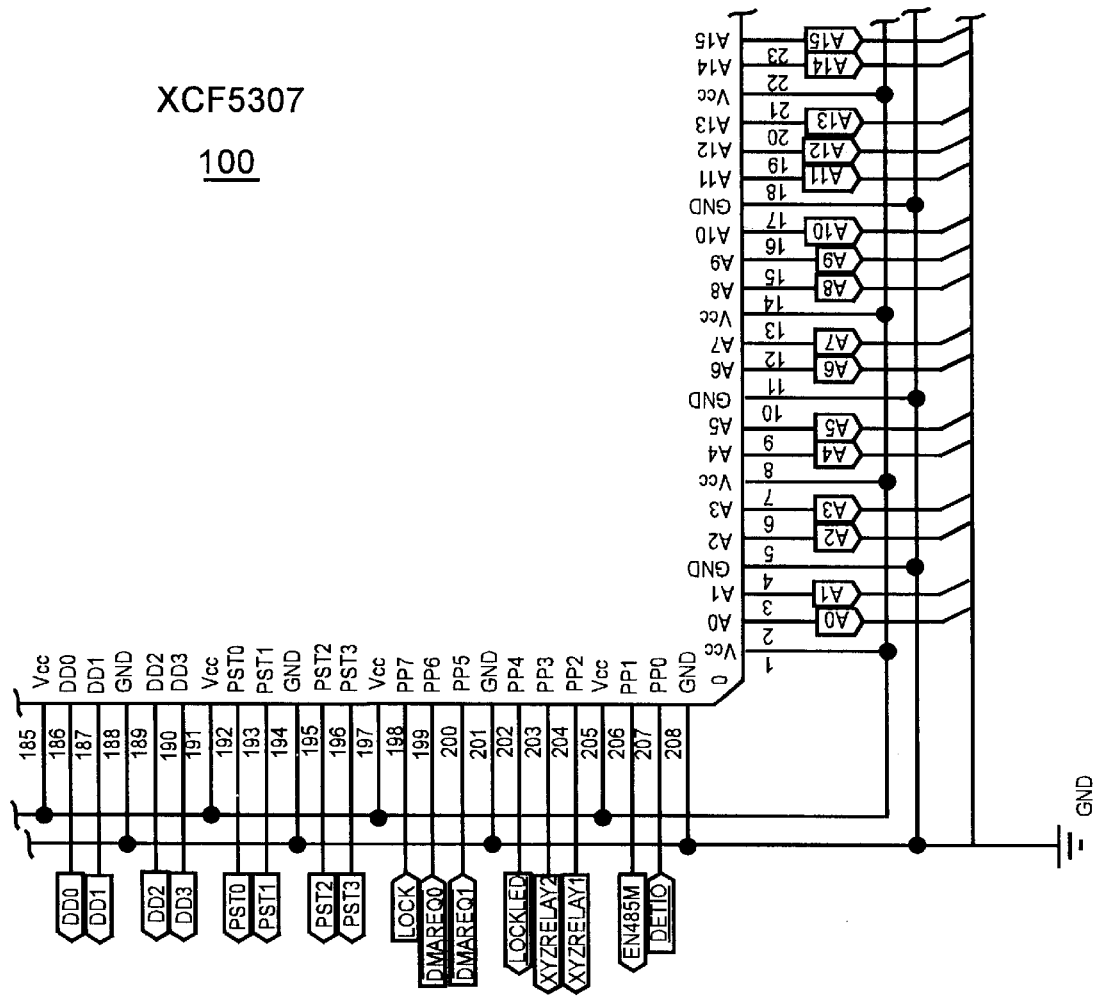

Referring to the drawings, FIGS. 1A–1D show a circuit schematic of a portion of a power metering device which uses the method and system of the invention. Briefly, the metering device utilizes a controller 100 which may be a microprocessor or microcontroller component of the type designated XCF5307 (Motorola), or other equivalent device. Additional circuitry associated with the power metering device is not relevant to the present invention and has not been shown herein.

The controller 100 is provided with a programmable oscillator 102 in accordance with the invention. In the illustrated embodiment, the programmable oscillator is programmed to oscillate at 33.1776 MHz, which as noted hereinabove, is a high order harmonic of 50 Hz, 60 Hz and 400 Hz line frequencies which may typically be monitored in various power systems. As indicated above, the programmable oscillator 102 may be of the type JITO-2, of the type SG-8002JF series or other equivalent components or equivalent circuits.

As indicated above, the provision of a programmable oscillator programmed to oscillate at this high order harmonic of the above-noted frequencies substantially eliminates timing error due to a frequency mismatch between the controller or processor 100 and the characteristic frequency of the current or other quantity which is to be monitored or measured by the system of the invention. Thus, together, the controller 100 and programmable oscillator 102 define a system clock for the monitoring system.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. A system clock for a system for measuring at least one given quantity having a periodic value which does not vary significantly from a given frequency, said system clock comprising:

a controller for sampling said given quantity at a rate determined by an oscillator frequency; and a programmable oscillator for generating said oscillator frequency, said programmable oscillator being programmable to produce said oscillator frequency at a frequency which is substantially identical to a high order harmonic of said given frequency of the quantity to be measured.

2. The system of claim 1 wherein said given quantity comprises at least one of a 50 Hz or 60 Hz or 400 Hz AC voltage or AC current.

3. An improvement in a system clock for a system for measuring at least one given quantity having a periodic value which does not vary significantly from a given frequency, said improvement comprising:

a controller for sampling said given quantity at a rate determined by an oscillator frequency; and a programmable oscillator for generating said oscillator frequency, said programmable oscillator being programmable to produce said oscillator frequency at a frequency which is substantially identical to a high order harmonic of said given frequency of the quantity to be measured.

4. The system of claim 3 wherein said quantity comprises at least one of a 50 Hz or 60 Hz or 400 Hz AC voltage or AC current.

5. A method for controlling a sampling rate for measuring at least one given quantity having a periodic value which does not vary significantly from a given frequency, said method comprising:

providing a programmable oscillator; and programming said oscillator to oscillate at a frequency which is substantially identical to a high order harmonic of said given frequency.

6. The method of claim 5 wherein said quantity comprises at least one of a 50 Hz or 60 Hz or 400 Hz AC voltage or AC current.

7. A system for controlling a sampling rate for measuring at least one given quantity having a periodic value which does not vary significantly from a given frequency, said system comprising:

programmable oscillator means; and means for programming said oscillator to oscillate at a frequency which is substantially identical to a high order harmonic of said given frequency.

8. The system of claim 7 wherein said quantity comprises at least one of a 50 Hz or 60 Hz or 400 Hz AC voltage or AC current.

* * * * *